(12) United States Patent
Stone et al.

(10) Patent No.: US 7,687,905 B2
(45) Date of Patent: Mar. 30, 2010

(54) INTEGRATED CIRCUIT PACKAGES, SYSTEMS, AND METHODS

(75) Inventors: Brent S. Stone, Chandler, AZ (US);
Dustin P. Wood, Chandler, AZ (US);
Kaladhar Radhakrishnan, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 12/039,077

(22) Filed: Feb. 28, 2008

(65) Prior Publication Data

US 2008/0142962 A1 Jun. 19, 2008

Related U.S. Application Data

(62) Division of application No. 10/880,150, filed on Jun. 28, 2004, now Pat. No. 7,339,263.

(51) Int. Cl.
*H01L 23/34* (2006.01)
*H01L 21/02* (2006.01)

(52) U.S. Cl. ..................................... 257/724

(58) Field of Classification Search ................ 257/678, 257/724, 737, 738, 779, 780, 782, E23.062, 257/E23.065, E23.068; 438/15, 25–28, 51, 438/55, 64–68, 106–127
See application file for complete search history.

(56) References Cited

U.S. PATENT DOCUMENTS

| | | | |
|---|---|---|---|
| 5,798,567 A * | 8/1998 | Kelly et al. ................ | 257/723 |
| 6,388,207 B1 | 5/2002 | Figueroa et al. | |
| 6,424,034 B1 | 7/2002 | Ahn et al. | |
| 6,489,686 B2 | 12/2002 | Farooq et al. | |
| 6,555,920 B2 | 4/2003 | Chung et al. | |
| 6,657,133 B1 * | 12/2003 | Chee .......................... | 174/260 |
| 6,703,697 B2 | 3/2004 | Leahy et al. | |
| 6,713,860 B2 | 3/2004 | Li | |
| 6,713,871 B2 * | 3/2004 | Searls et al. ................ | 257/738 |
| 6,777,818 B2 | 8/2004 | Baldwin | |
| 7,019,346 B2 | 3/2006 | Mosley | |
| 7,053,491 B2 | 5/2006 | Martin et al. | |
| 7,268,419 B2 | 9/2007 | Cornelius | |
| 7,339,263 B2 | 3/2008 | Stone et al. | |
| 2002/0135053 A1 | 9/2002 | Figueroa et al. | |
| 2003/0102555 A1 | 6/2003 | Patel et al. | |
| 2003/0122638 A1 | 7/2003 | Tarui et al. | |
| 2004/0027813 A1 | 2/2004 | Li | |
| 2004/0124511 A1 * | 7/2004 | Li .............................. | 257/678 |
| 2004/0245014 A1 | 12/2004 | Zhong et al. | |

(Continued)

OTHER PUBLICATIONS

"U.S. Appl. No. 10/880,150, Advisory Action mailed May 18, 2006", 2 pgs.

(Continued)

*Primary Examiner*—Dao H Nguyen
*Assistant Examiner*—Tram H Nguyen
(74) *Attorney, Agent, or Firm*—Schwegman, Lundberg & Woessner, P.A.

(57) ABSTRACT

An integrated circuit package includes a first capacitor supported by a surface of a substrate, and a second capacitor supported by the surface of the substrate. The first capacitor is within a die shadow region, and the second capacitor lies outside of the die shadow region.

6 Claims, 3 Drawing Sheets

U.S. PATENT DOCUMENTS

2004/0245610 A1 12/2004 Zhong et al.
2005/0285243 A1 12/2005 Stone et al.
2006/0288567 A1 12/2006 Lloyd et al.

OTHER PUBLICATIONS

"U.S. Appl. No. 10/880,150, Final Office Action mailed Feb. 6, 2006", 19 pgs.

"U.S. Appl. No. 10/880,150, Non-Final Office Action mailed Dec. 11, 2006", 12 pgs.

"U.S. Appl. No. 10/880,150, Non-Final Office Action mailed May 4, 2007", 12 pgs.

"U.S. Appl. No. 10/880,150, Non-Final Office Action mailed Aug. 11, 2006", 13 pgs.

"U.S. Appl. No. 10/880,150, Non-Office Action mailed Oct. 21, 2005", 13 pgs.

"U.S. Appl. No. 10/880,150, Notice of Allowance mailed Oct. 4, 2007", NOAR, 4 pgs.

"U.S. Appl. No. 10/880,150, Preliminary Amendment filed Aug. 31, 2005", 9 pgs.

"U.S. Appl. No. 10/880,150, Response filed Nov. 10, 2006 to Non-Final Office Action mailed Aug. 11, 2006", 9 pgs.

"U.S. Appl. No. 10/880,150, Response filed Dec. 21, 2005 to Non-Final Office Action mailed Oct. 21, 2005", 10 pgs.

"U.S. Appl. No. 10/880,150, Response filed Feb. 12, 2007 to Non-Final Office Action mailed Dec. 11, 2006", 8 pgs.

"U.S. Appl. No. 10/880,150, Response filed May 5, 2006 to Final Office Action mailed Feb. 6, 2006", 9 pgs.

"U.S. Appl. No. 10/880,150, Response filed Aug. 31, 2005 to Restriction Requirement mailed May 18, 2006", 9 pgs.

"U.S. Appl. No. 10/880,150, Response filed Aug. 6, 2007 to Non-Final Office Action mailed May 4, 2007", 8 pgs.

"U.S. Appl. No. 10/880,150, Restriction Requirement mailed Aug. 3, 2005", 5 pgs.

* cited by examiner

INTEGRATED CIRCUIT PACKAGES, SYSTEMS, AND METHODS

This application is a divisional of U.S. patent application Ser. No. 10/880,150, filed on Jun. 28, 2004, now issued as U.S. Pat. No. 7,339,263, which is incorporated herein by reference in its entirety.

BACKGROUND

Electronic circuits, and particularly computer and instrumentation circuits, have in recent years become increasingly powerful and fast. For example, a frequency at which a processor runs (Fmax) has increased in recent years from 8 megahertz (Mhz) up to about 3.6 gigahertz (GHz) for current Pentium 4 processors. Often, processors with a higher Fmax have a higher price tag.

As Fmax continues to increase, noise in the power and ground lines increasingly becomes an issue. This noise can arise due to inductive and capacitive parasitics in a power delivery path, for example. To reduce such noise, capacitors known as bypass capacitors are often used to provide a stable signal or stable supply of power to the circuitry. Often capacitors are used to suppress unwanted radiation, to dampen voltage overshoot when an electronic device (e.g., a processor) is powered down, and to dampen voltage droop when the device powers up.

Bypass capacitors are generally placed as close as practical to a die load in order to increase the capacitors' effectiveness by reducing the parasitic inductance. Often, the bypass capacitors are surface-mounted to a land side of a package substrate opposite a die side of the package substrate.

BRIEF DESCRIPTION

DETAILED DESCRIPTION

Embodiments of the invention include mounting capacitors formed on a motherboard side or a land side of a package substrate within multiple cavities.

Figure 1:
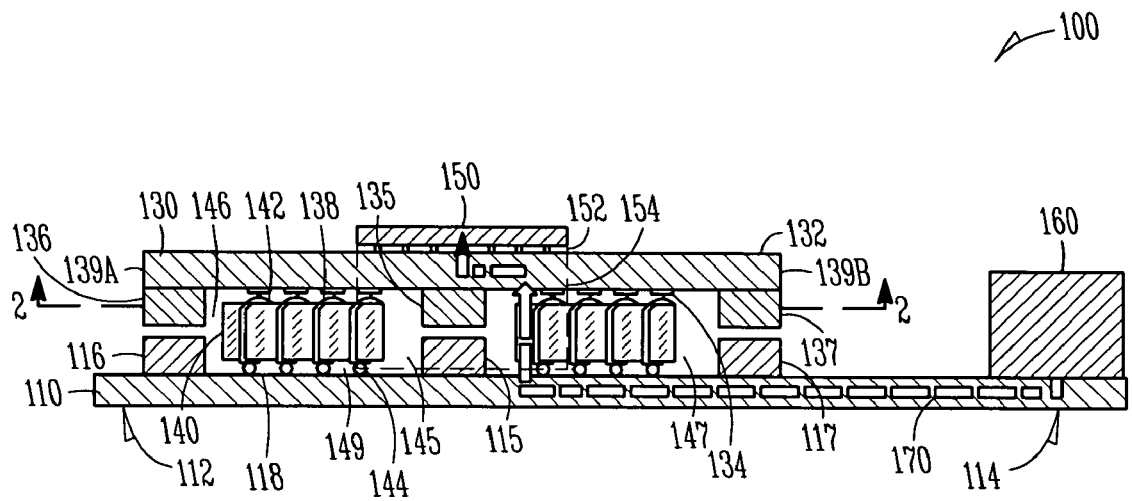
FIG. 1 illustrates a cross-sectional, side view of an electronic assembly in accordance with an embodiment.

FIG. 1 illustrates a cross-sectional, side view of an electronic assembly 100 in accordance with an embodiment. The electronic assembly 100 has a motherboard 110 with a first section 112 and a second section 114. In an embodiment, supported by the first section 112 of the motherboard 110 are back-side capacitors (BSCs) 115, 116, 117 and land pads 118. In yet other embodiments, the motherboard does not include BSCs. In another embodiment, the motherboard has connectors other than land pads 118, such as pins.

The electronic assembly 100 includes a package substrate 130 supported by the first section 112 of the motherboard 110. Conductive layers (not shown) in the package substrate 130 carry power, ground, and signals through the substrate. In an embodiment, the conductive layers are formed from 200 micron (μm) copper planes, although other conductive materials such as tin, lead, nickel, gold, palladium or other materials may be used in other embodiments. Non-conductive material of the substrate may be formed from organic printed circuit board (PCB) materials, such as an epoxy material, in an embodiment. For example, standard PC board materials such as FR-4 epoxy-glass, polyimide-glass, benzocyclobutene, Teflon, other epoxy resins, injection-molded plastic or the like may be used in various embodiments. In some embodiments, the non-conductive material may include inorganic PC board materials, such as ceramic, for example.

The substrate 130 includes a die side (or first surface) 132, and a motherboard side (or second surface) 134. In an embodiment, along the motherboard side 134 of the substrate are land-side capacitors (LSCs) 135, 136, 137 and Land Grid Array (LGA) package land pads 138. In an embodiment, the LSCs 135, 136, 137 correspond to the BSCs 115, 116, 117, respectively. In an embodiment, the substrate has a first exterior edge 139A, and a second exterior edge 139B opposite the first exterior edge. In an embodiment, the second LSC 136 is adjacent the first exterior edge 139A, and the third LSC 137 is adjacent the second exterior edge 139B. In an embodiment, the second LSC and third LSC are substantially equidistant from the first LSC.

In an embodiment, a socket 140 electrically and mechanically couples the substrate 130 and the motherboard 110. In an embodiment, the socket is made of a polymer housing. In an embodiment, the socket 140 includes socket contacts 142 that correspond to the LGA package land pads 138. In an embodiment, the socket 140 also includes solder balls 144 that mate to the corresponding land pads 118 of the motherboard 110. In an embodiment, the solder balls 144 in a ball grid array are reflowed to form an electrical-mechanical connection between the socket and the motherboard. In another embodiment, the package substrate has pins of a Pin Grid Array (PGA), instead of the LGA package land pads 138, that mate with complementary pin holes in the socket 140.

A socket central cavity 145 is between the substrate and the motherboard, and it is surrounded by a socket contact region 149 (see FIG. 2) of the socket 140. In an embodiment, in the socket contact region 149, the socket contacts 142 mate to the land pads 138 of the substrate.

Within the socket central cavity 145 is the first LSC 135, in an embodiment, as shown in FIG. 1. In an additional embodiment, the first BSC 115 is within the socket central cavity 145. The socket 140 further has additional socket cavities in an embodiment. In an embodiment, the additional socket cavities are in the areas on the motherboard side where there are no pads.

In an embodiment, the socket 140 has a first socket cavity 146 defined on at least three sides by the socket contact region 149. In an embodiment, the first socket cavity 146 is exterior to the socket contact region 149. In an embodiment, the first socket cavity 146 is adjacent the first exterior edge 139A of the substrate. Within the first socket cavity 146 is the second LSC 136. In an additional embodiment, the second BSC 116 is within the first socket cavity 146.

In an embodiment, the socket 140 has a second socket cavity 147 defined on at least three sides by the socket contact region 149. In an embodiment, the second socket cavity 147 is exterior to the socket contact region 149. In an embodiment, the second socket cavity 147 is adjacent the second exterior edge 139B of the substrate. Within the second socket cavity 147 is the third LSC 137. In an additional embodiment, the third BSC 117 is within the second socket cavity 147.

The socket contact region 149, in an embodiment, surrounds the socket central cavity 145 and separates the socket central cavity 145 from the other socket cavities. The socket central cavity 145 of the socket 140 has a width that is less than about 17 millimeters (mm) square, in an embodiment. In an embodiment, capacitors other than the first capacitor (LSC) 135 are substantially excluded from a die shadow region 154, as described in more detail below. With the first LSC of the LSCs being substantially exclusively positioned within the socket central cavity, the cavity size is minimized when the socket contact region is moved closer to the edges of the first LSC. In an embodiment, the socket central cavity 145 is about 12 mm square.

In an embodiment, the first LSC 135 is less than about 12 mm square. In an embodiment, the land-side capacitors are about 80 mils×about 50 mils. In an additional embodiment, the land-side capacitors are about 2 mm×about 1.25 mm. In various embodiments, each capacitor illustrated is one of a ceramic capacitor, aluminum oxide capacitor, organic capacitor or a capacitor made using one or more other technologies. These capacitors may have from two to many external terminals distributed on two or four sides. In addition, the actual and relative dimensions of the package substrates, integrated circuits, and discrete capacitors may vary widely, depending on design and manufacturing constraints or other factors.

The electronic assembly 100 includes a die 150 supported by the die side 132 of the substrate 130. In one embodiment, the IC substrate 130 is interposed between the die 150 and a first section 112 of the motherboard 110. The die 150 has connectors 152 to electrically and mechanically couple the die 150 to the substrate 130. In an embodiment, the connectors 152 include reflowed solder bumps.

The die shadow region 154, shown in dashed lines in an embodiment, is substantially directly underneath the die 150 in a direction towards the motherboard 110. In an embodiment, the socket central cavity 145 and the first LSC 135 are within the die shadow region 154. In another embodiment, the board-side capacitor 115 is within the die shadow region 154. In an embodiment, the first and second socket cavities 146 and 147, and the corresponding second and third LSCs 136, 137 each lie outside of the die shadow region 154. In another embodiment, the board-side capacitors 116, 117 lie outside of the die shadow region 154.

At least a portion of the socket 140 and the socket contact region 149 is within the die shadow region 154, as shown in FIG. 1, according to an embodiment. In an embodiment, at least one of the socket contacts 142 is in the die shadow region. In an embodiment, the plurality of LSCs other than the LSC in the socket center cavity 145 is substantially excluded from being positioned within the die shadow region 154.

A voltage regulator (VR) 160 may be provided on the motherboard at the second section 114. In an embodiment, the VR is used to supply power to the die 150 (e.g., a processor). In an embodiment, the VR is a two-sided VR configuration, in which the VR components are placed on two sides surrounding the socket 140 (not shown).

In an embodiment, a power delivery path 170 runs from the voltage regulator 160 through the motherboard 110, through the socket contact region 149 in the die shadow region 154, laterally through the substrate 130 in the die shadow region 154, and to the die 150. In an embodiment, a resistance of the substrate lateral power delivery path 170 directly relates to a power path length through the substrate (from the socket 140 to the die 150). In an embodiment, the path resistance is minimized by minimizing a power path length through the substrate 130.

In an embodiment, wherein the lateral power delivery path of the substrate is substantially exclusively in the die shadow region, the resistance reduces by up to about 30%.

In an additional embodiment, when the socket contact region 149 has multiple cavities (including, e.g., cavities 145, 146, 147) as compared with just having a large single center cavity (not shown) of about 17 mm by about 17 mm that may include more than one capacitor, the resistance in the power path is reduced significantly, and may be reduced up to about 30%. In an embodiment, a size of the socket central cavity 145 is minimized to about 12 mm by about 12 mm, such that the socket 140 is at least partially in the die shadow region. Therefore, the power delivery path 170 through the socket 140 and through the substrate 130 is substantially exclusively in the die shadow region, consequently minimizing the lateral power delivery path in the package substrate, and thus the path resistance.

In an additional embodiment, the path resistance depends upon the voltage regulator 160, the design of the socket 140, and the thickness of the conductive layers in the package substrate 130.

In an embodiment, there is an electrical impedance associated with the power delivery path 170. In an embodiment, current through this impedance creates a voltage drop at the die 150. The reduction in voltage directly impacts a maximum operating frequency, Fmax, of the die or processor.

The impedance in the power delivery path may be categorized as resistive and as inductive. The resistive drop is proportional to the direct current (DC) through the path 170. The inductive drop, which is alternating current (AC), is proportional to a rate of change of current (di/dt). When there is processor activity, there is a sudden surge in current, which results in a large inductive drop. In an embodiment, this inductive drop may be countered through one or more stages of decoupling capacitors at suitable points in the power delivery path.

In an embodiment, decoupling capacitors may reduce the overall impedance of the power delivery path over a broad frequency range. In another embodiment, decoupling capacitors may dampen voltage droop (or rate at which a voltage drifts) when a processor powers up.

In an embodiment, there are three levels of voltage droops: first-level voltage droop, second-level voltage droop, and third-level voltage droop. In an embodiment, the first-level voltage droop is dictated by capacitance of the die and inductance of the package substrate. In an embodiment, the second-level voltage droop is dictated by capacitance of the package substrate and a socket inductance. In an embodiment, the third-level voltage droop is dictated by high-frequency motherboard capacitors, inductance to the voltage regulator (or voltage regulator module), and the resistance of the path.

In an embodiment, the decoupling capacitors dampen at least one of the first-level, second-level, and third-level voltage droops. In an embodiment, the first LSC 135 is the decoupling capacitor associated with the first level voltage droop. In an embodiment, the capacitor 135 is placed as close to a die load or "hot spot" as practical in order to increase this capacitor's effectiveness. Therefore, the first LSC 135 is positioned in the socket central cavity, in an embodiment. In an additional embodiment, the first LSC is used for second-droop decoupling.

In an embodiment, the second LSC 136, and the third LSC 137 are second-droop capacitors. In an additional embodiment, there are four (4) second-droop capacitors (see, e.g., FIG. 2). In other embodiments, there may be any number of second-droop capacitors. In an embodiment, the second-droop capacitors are substantially symmetrical about the socket center cavity 145. In an additional embodiment, the second-droop capacitors are each outside of the die shadow region. In an embodiment, decoupling of the package substrate is minimally affected by having the second-droop capacitors outside of the die shadow region, as opposed to having the second-droop capacitors within the die shadow region. In an embodiment, decoupling of the package substrate is minimally affected because the second-droop capacitors are not considered to be sensitive to a distance from the die.

In an embodiment, the board-side capacitors, including at least one of the first BSC 115, the second BSC 116, and the third BSC 117, are third droop capacitors to dampen the third level voltage droop. In an additional embodiment, the second LSC 136 and third LSC 137 assist in third droop decoupling. In an embodiment, third droop performance improves as the total path resistance from the VR to the die is reduced. In an embodiment where the lateral path resistance through the package substrate (substantially exclusively in the die shadow region) is reduced, and thus the total path resistance is reduced, the third level voltage droop is then thus reduced.

Figure 2:
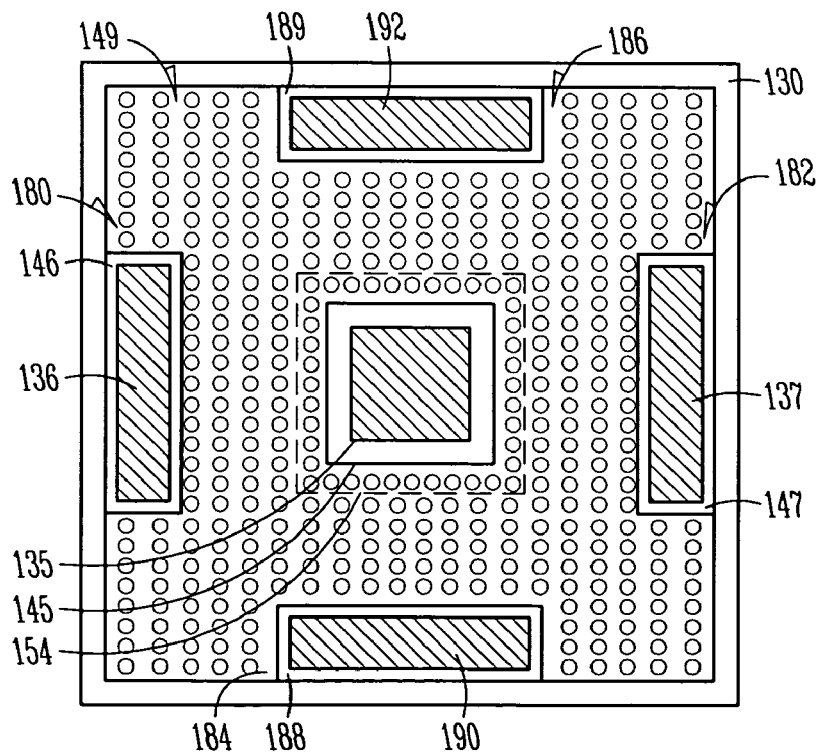
FIG. 2 illustrates a cross-sectional, plan view taken through section 2-2 of FIG. 1.

FIG. 2 illustrates a cross-sectional, plan view taken through section 2-2 of FIG. 1. The die shadow region 154 is shown in dashed lines in an embodiment. At least a portion of the socket contact region 149 is shown to be within the die shadow region of an embodiment. Within the die shadow region 154 is the socket central cavity 145. And within the socket central cavity 145 is the first LSC 135 in an embodiment.

In an embodiment, the substrate 130 has a first section 180, a second section 182 opposite the first section, a third section 184 between the first and section sections, and a fourth section 186 opposite the third section. In an embodiment, in the first section 180 is the first socket cavity 146. Within the first socket cavity is the second LSC 136. In the second section 182 is the second socket cavity 147. Within the second socket cavity is the third LSC 137. In the third section 184 is a third socket cavity 188. Within the third socket cavity is a fourth LSC 190. In the fourth section 186 is a fourth socket cavity 189. Within the fourth socket cavity is a fifth LSC 192.

In an embodiment, the additional LSCs 190, 192 are both outside of the die shadow region 154. In an embodiment, the LSCs 190, 192 are second-droop capacitors. In an embodiment, the second, third, fourth, and fifth LSCs 136, 137, 190, 192 are substantially equidistant from the central LSC 135. In an embodiment, the sections 180, 182, 184, 186 are adjacent exterior edges of the socket contact region 149, in that at least one edge of each socket cavity 146, 147, 188, 189 is not bounded by the socket contact region 149.

Figure 3:
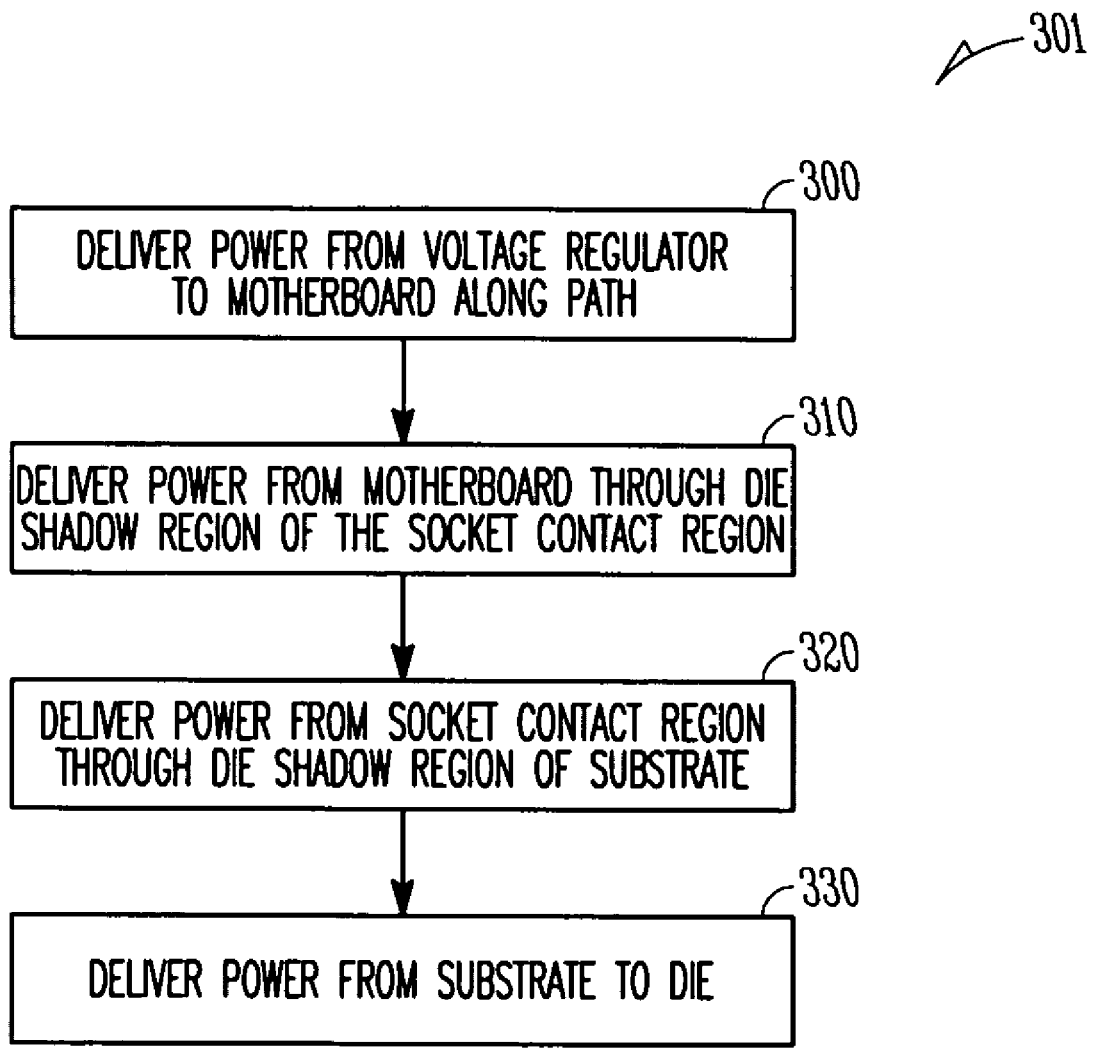
FIG. 3 illustrates a flowchart of a method to deliver power through an IC package, in accordance with an embodiment.

FIG. 3 illustrates a flowchart 301 of at least one method for delivering power through an integrated circuit package, in accordance with an embodiment. More specifically, regarding this embodiment, flow chart 301 describes at least one method to deliver power to a die along a path on a motherboard.

At 300, power is delivered from a voltage regulator (VR) to a motherboard along a path.

At 310, power is delivered from the motherboard through a die shadow region of a socket contact region of a substrate to which the die is coupled.

At 320, power is delivered from the socket contact region through the die shadow region of the substrate.

At 330, power is delivered from the substrate to the die.

It will be understood by those of ordinary skill that flowchart 301 may embody a number of different methods to deliver power to a die, depending upon the selection, arrangement, and order of the elements and operations described therein, in accordance with the teachings of this application. It will be further understood that in an embodiment, the various elements mentioned in the above description of FIG. 3 may be corresponding elements from FIGS. 1 and 2.

Figure 4:
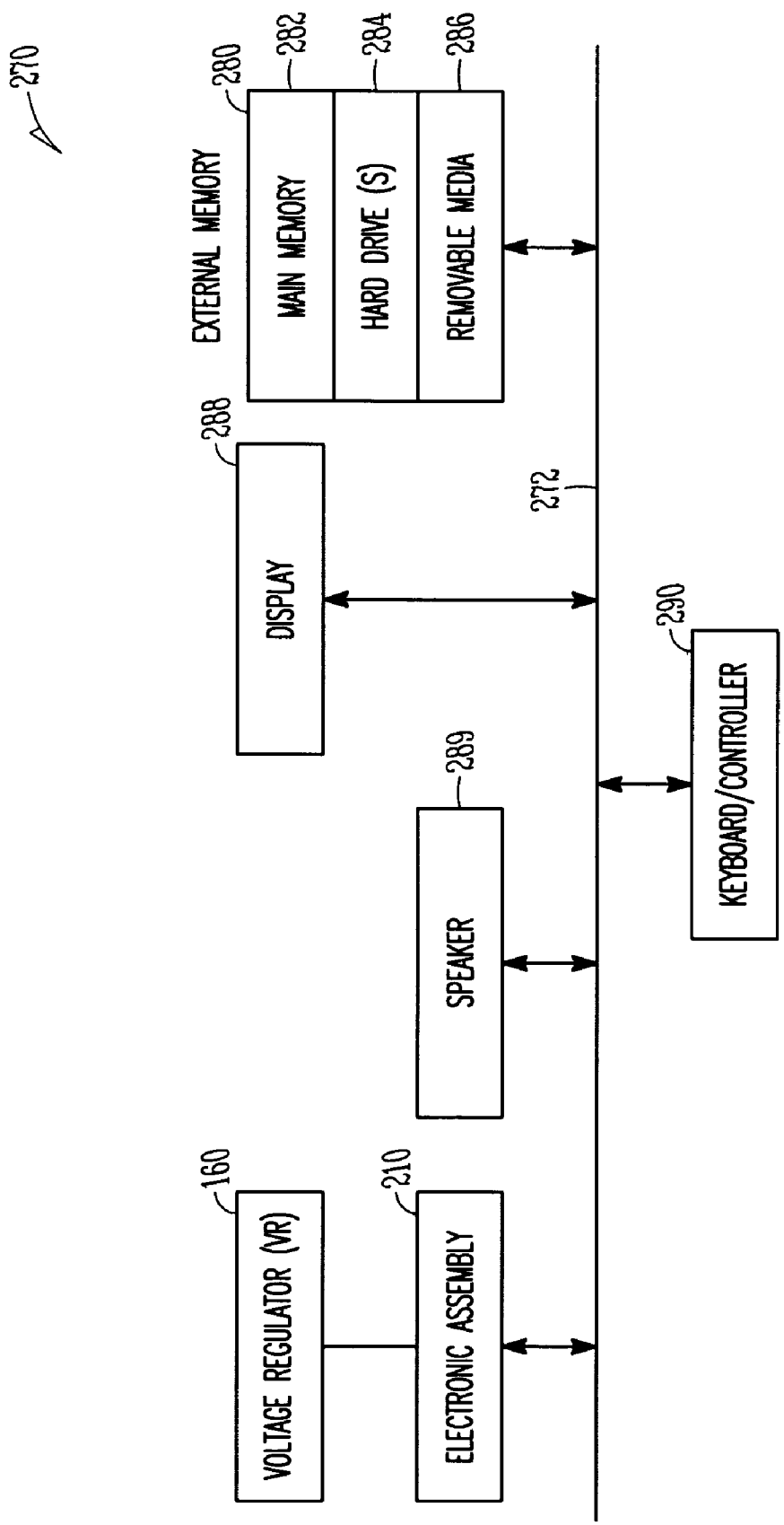
FIG. 4 is a block diagram of a system according to an embodiment.

FIG. 4 is a block diagram of a system 270 according to an embodiment. In an embodiment, the system 270 may be a wireless system. For purposes of this disclosure, the system 270 embodying components in accordance with the claimed subject matter may include any system that utilizes an electronic assembly. In embodiments, the system 270 is an electronic system or a computer system.

The system 270 includes an electronic assembly 210 that is electrically coupled to various components in the system 270 via a system bus 272. Any of the electronic assemblies 210 described herein may be electrically coupled to system bus 272. Electronic assembly 210 may include, for example, a microprocessor, a microcontroller, memory, a graphics processor or a digital signal processor, and/or a custom circuit or an application-specific integrated circuit, such as a communications circuit for use in wireless devices such as cellular telephones, pagers, portable computers, two-way radios, and similar electronic systems. System bus 272 may be a single bus or any combination of busses.

The system 270 may also include an external memory 280 that in turn includes one or more memory elements suitable to the particular application, such as a main memory 282 in the form of random access memory (RAM), one or more hard drives 284, and/or one or more drives that handle removable media 286, such as floppy diskettes, compact disks (CDs) and digital video disks (DVDs).

The electronic system 270 may also include a display device 288, a speaker 289, and a controller 290, such as a keyboard, mouse, trackball, game controller, microphone, voice-recognition device, or any other device that inputs information into the system 270.

FIGS. 1 to 4 are merely representational and are not drawn to scale. Certain proportions thereof may be exaggerated, while others may be minimized. Many other embodiments will be apparent to those of skill in the art upon reviewing the above description. Parts of some embodiments may be included in, or substituted for, those of other embodiments. The accompanying drawings that form a part hereof show by way of illustration, and not of limitation, specific embodiments in which the subject matter may be practiced. Embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

The illustrations of embodiments described herein are intended to provide a general understanding of the structure of various embodiments, and they are not intended to serve as a complete description of all the elements and features of apparatus and systems that might make use of the structures described herein.

In the foregoing Detailed Description, various features are grouped together in a single embodiment for the purpose of streamlining the disclosure. This method of disclosure is not to be interpreted as reflecting an intention that the claimed embodiments have more features than are expressly recited in each claim. Thus the following claims are hereby incorporated into the Detailed Description, with each claim standing on its own as a separate embodiment.

Although the description of the various embodiments refers primarily to using capacitors in conjunction with an integrated circuit package, the various embodiments also may be used in conjunction with other types of packages, interposers, printed circuit (PC) boards or other electronic circuit housings. In addition, the various embodiments may be used with a number of different types of packaging technologies. For example, the various embodiments may be used with organic or ceramic packages.

Applications that may include the apparatus and systems of various embodiments include electronic circuitry used in high-speed computers, communication and signal processing circuitry, modems, processor modules, embedded processors, data switches, and application-specific modules, including multilayer, multi-chip modules. Such apparatus and systems may further be included as sub-components within a variety of electronic systems, such as televisions, cellular telephones, personal computers, personal digital assistants (PDAs), workstations, radios, video players, vehicles, and others.

The elements, materials, geometries, dimensions, and sequence of operations can all be varied to suit particular packaging requirements. For example, any of the above-described cavities, including the socket center cavity, may have more than a single capacitor positioned therein. While the foregoing examples of dimensions and ranges are considered typical, the various embodiments of the invention are not limited to such dimensions or ranges. It is recognized that the trend within industry is to generally reduce device dimensions for the associated cost and performance benefits.

The Abstract is provided to comply with 37 C.F.R. §1.72(b) to allow the reader to quickly ascertain the nature and gist of the technical disclosure. The Abstract is submitted with the understanding that it will not be used to interpret or limit the scope or meaning of the claims.

It will be readily understood to those skilled in the art that various other changes in the details, material, and arrangements of the parts and method stages which have been described and illustrated in order to explain the nature of embodiments of this invention may be made without departing from the principles and scope of embodiments of the invention as expressed in the subjoined claims.

What is claimed is:

1. A package comprising:
a substrate having a first surface adapted to receive a die on a die receiving portion thereof, and a second surface disposed opposite the first surface, an outline of the die receiving portion defining a die shadow region in a direction from the first surface to the second surface, the substrate includes a first section adjacent a first edge of the die receiving portion and a second section adjacent a second opposite edge of the die receiving portion and the substrate includes a third section adjacent a third edge of the die receiving portion and a fourth section adjacent a fourth edge of the die receiving portion, and the substrate is positionable on a motherboard;
a socket contact region between the motherboard and the substrate, wherein the socket contact region including a first socket cavity is the first section of the substrate, a second socket cavity is the second section of the substrate, a third socket cavity is the third section of the substrate, a fourth socket cavity is the fourth section of the fourth section of the substrate; and a socket central cavity is within the die shadow region;
a first capacitor supported by the second surface in the die shadow region;
a second capacitor engaged along the second surface of the substrate outside of the die shadow region;
a third capacitor is engaged along and is outside of the die shadow region, wherein the second capacitor is positioned in the first section of the substrate, and wherein the third capacitor is positioned in the second section of the substrate;
a fourth capacitor is engaged along and is outside of the die shadow region, and
a fifth capacitor is engaged along the second surface and is outside of the die shadow region, wherein the fourth capacitor is positioned in the third section of the substrate, wherein the fifth capacitor is positioned in the fourth section of the substrate.

2. The package of claim 1, wherein the first section has a first exterior edge, and the second section has a second exterior edge, wherein the second capacitor is adjacent the first exterior edge, wherein the third capacitor is adjacent the second exterior edge.

3. The package of claim 1, wherein the second capacitor and the third capacitor are substantially equidistant from the first capacitor.

4. The package of claim 1, wherein the substrate includes a third section adjacent a third edge of the die receiving portion and a fourth section adjacent a fourth edge of the die receiving portion, wherein a fourth capacitor is supported by the second surface and is outside of the die shadow region, wherein the fourth capacitor is positioned in the third section of the substrate, wherein the fifth capacitor is positioned in the fourth section of the substrate.

5. A package comprising:
a substrate having a first surface adapted to receive a die on a die receiving portion thereof, and a second surface disposed opposite the first surface, an outline of the die receiving portion defining a die shadow region in a direction from the first surface to the second surface, the substrate includes a first section adjacent a first edge of the die receiving portion and a second section adjacent a second opposite edge of the die receiving portion and the substrate includes a third section adjacent a third edge of the die receiving portion and a fourth section adjacent a fourth edge of the die receiving portion, and the substrate is positionable on a motherboard;
a socket contact region between the motherboard and the substrate, wherein the socket contact region including a first socket cavity is the first section of the substrate, a second socket cavity is the second section of the substrate, a third socket cavity is the third section of the substrate, a fourth socket cavity is the fourth section of the fourth section of the substrate; and a socket central cavity is within the die shadow region;
a first capacitor supported by the second surface in the die shadow region wherein the first capacitor is less than about 12 mm in length and less than 12 mm in width;
a second capacitor engaged along the second surface of the substrate outside of the die shadow region;
a third capacitor is engaged along and is outside of the die shadow region, wherein the second capacitor is positioned in the first section of the substrate, and wherein the third capacitor is positioned in the second section of the substrate;
a fourth capacitor is engaged along and is outside of the die shadow region, and
a fifth capacitor is engaged along the second surface and is outside of the die shadow region, wherein the fourth capacitor is positioned in the third section of the substrate, wherein the fifth capacitor is positioned in the fourth section of the substrate.

6. A package comprising:
a substrate having a first surface adapted to receive a die on a die receiving portion thereof, and a second surface disposed opposite the first surface, an outline of the die receiving portion defining a die shadow region in a direction from the first surface to the second surface, the substrate includes a first section adjacent a first edge of the die receiving portion and a second section adjacent a second opposite edge of the die receiving portion and the substrate includes a third section adjacent a third edge of the die receiving portion and a fourth section adjacent a fourth edge of the die receiving portion, wherein the substrate has a lateral power delivery path, and when the lateral power delivery path of the substrate is substantially exclusively in the die shadow region, a resistance through the substrate reduces by up to about 30%, and the substrate is positionable on a motherboard;

a socket contact region between the motherboard and the substrate, wherein the socket contact region including a first socket cavity is the first section of the substrate, a second socket cavity is the second section of the substrate, a third socket cavity is the third section of the substrate, a fourth socket cavity is the fourth section of the fourth section of the substrate; and a socket central cavity is within the die shadow region;

a first capacitor supported by the second surface in the die shadow region;

a second capacitor engaged along the second surface of the substrate outside of the die shadow region;

a third capacitor is engaged along and is outside of the die shadow region, wherein the second capacitor is positioned in the first section of the substrate, and wherein the third capacitor is positioned in the second section of the substrate;

a fourth capacitor is engaged along and is outside of the die shadow region, and a fifth capacitor is engaged along the second surface and is outside of the die shadow region, wherein the fourth capacitor is positioned in the third section of the substrate, wherein the fifth capacitor is positioned in the fourth section of the substrate.

\* \* \* \* \*